(12) United States Patent
Jeong

(10) Patent No.: US 7,876,134 B2
(45) Date of Patent: Jan. 25, 2011

(54) CIRCUIT FOR CHANGING FREQUENCY OF A SIGNAL AND FREQUENCY CHANGE METHOD THEREOF

(75) Inventor: Chun Seok Jeong, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 18 days.

(21) Appl. No.: 12/494,408

(22) Filed: Jun. 30, 2009

(65) Prior Publication Data
US 2010/0264960 A1 Oct. 21, 2010

(30) Foreign Application Priority Data
Apr. 15, 2009 (KR) ....................... 10-2009-0032898

(51) Int. Cl.
*H03B 19/00* (2006.01)
(52) U.S. Cl. ...................... 327/113; 327/114
(58) Field of Classification Search ................. 327/113, 327/114, 115–119
See application file for complete search history.

(56) References Cited

U.S. PATENT DOCUMENTS

| 6,339,346 | B1 | 1/2002 | Jones, Jr. | |
| 6,362,668 | B1 * | 3/2002 | Lutley et al. | 327/113 |
| 7,015,737 | B2 | 3/2006 | Cho | |
| 7,068,081 | B2 * | 6/2006 | Naffziger et al. | 327/105 |
| 7,075,853 | B2 | 7/2006 | Jeong et al. | |
| 7,132,863 | B2 | 11/2006 | Wadhwa et al. | |
| 7,145,371 | B2 * | 12/2006 | Keithley et al. | 327/113 |
| 7,667,504 | B2 * | 2/2010 | Braun et al. | 327/113 |
| 2005/0140403 | A1 | 6/2005 | Lee | |

FOREIGN PATENT DOCUMENTS

JP 2002-076853 A 3/2002

\* cited by examiner

*Primary Examiner*—Hai L Nguyen
(74) *Attorney, Agent, or Firm*—Ladas & Parry LLP

(57) ABSTRACT

A signal frequency change circuit is presented. The signal frequency change circuit includes a delay line, a detector, a controller, a multiplexer, and an output unit. The delay line delays a clock signal by a first delay time corresponding to a delay control signal to generate a delay signal and delays the clock signal by a second delay time shorter than a first delay time to generate a pre-frequency change clock signal. The detector generates a phase locked completion signal. The controller sequentially shifts the delay control signal and a multiplexing control signal. The multiplexer selects and outputs one of the pre-frequency change clock signals. The output unit generates a frequency change clock signal.

29 Claims, 6 Drawing Sheets

CIRCUIT FOR CHANGING FREQUENCY OF A SIGNAL AND FREQUENCY CHANGE METHOD THEREOF

CROSS-REFERENCES TO RELATED PATENT APPLICATION

The present application claims priority under 35 U.S.C 119(a) to Korean Application No. 10-2009-0032898, filed on Apr. 15, 2009, in the Korean Intellectual Property Office, which is incorporated herein by reference in its entirety as set forth in full.

BACKGROUND

1. Technical Field

The present invention described herein relates to a semiconductor integrated circuit, and more particularly, to a circuit for changing a frequency of a signal and a frequency change method thereof.

2. Related Art

A semiconductor integrated circuit needs a clock signal having a frequency higher than a frequency of a clock signal provided from an external controller in order to test the operation thereof.

A semiconductor test device does not provide a suitable clock signal having a high frequency for testing the semiconductor integrated circuit.

Therefore, a signal frequency change circuit, which changes a frequency of a clock signal provided from the outside, for example, to a frequency twice as high, is provided internally within the semiconductor integrated circuit.

FIG. 1 is a circuit diagram of a signal frequency change circuit 1 according to one example well known in the prior art and FIG. 2 is a block diagram of a signal frequency change circuit 10 according to another example well known in the prior art.

As shown in FIG. 1, the signal frequency change circuit 1 according to the prior art includes a delay device 'DLY' and an XOR gate 'XOR1'.

The signal frequency change circuit 1 shown in FIG. 1 performs XOR on a clock signal 'CLK' and an output signal 'A' of the delay device 'DLY' to generate an output signal 'OUT' having a frequency that is two times higher than a frequency of the clock signal 'CLK'.

As shown in FIG. 2, the signal frequency change circuit 10 according to another embodiment of the prior art includes a counter 11, an oscillator 12, and a logic circuit 13.

In the signal frequency change circuit 10 shown in FIG. 2, the oscillator 12 generates an oscillation signal (OSC) having a higher frequency than the clock signal 'CLK' and the counter 11 counts and outputs the oscillation signal 'OSC'. And, the logic circuit 13 generates the output signal 'OUT' having a period corresponding to half of one period of the clock signal 'CLK', that is, a frequency that is two times higher than the frequency of the clock signal 'CLK' using the output of the counter 11.

Even though a structure of the signal frequency change circuit 1 according to the prior art is simple, problems can arise in that a duty cycle of the output signal 'OUT' significantly fluctuates according to the delay device 'DLY', which increases the probability of generating a duty cycle error. For example, the duty error of the clock signal 'CLK' can occur as jitter in a rising edge of the output signal 'OUT'.

Further, the signal frequency change circuit 10 according to the prior art can exhibit problems in that the current consumption is increased according to the operation of the oscillator 12 and the circuit area is increased according to the increase in the number of bits of the output signal of the counter 11.

SUMMARY

A signal frequency change circuit capable of minimizing a duty cycle error and reducing current consumption and a frequency change method thereof are described herein.

In one embodiment, a signal frequency change circuit according to the embodiment includes a delay line configured to delay a clock signal by a first delay time corresponding to a delay control signal to generate a delay signal and delays the clock signal by a second delay time smaller than a first delay time to generate a pre-frequency change clock signal; a detector configured to detect a specific phase of the clock signal using the delay signal to generate a phase locked completion signal; a controller configured to sequentially shift the delay control signal and a multiplexing control signal using the clock signal supplied before an activation timing point of the phase locked completion signal; a multiplexer configured to select and output one of the pre-frequency change clock signals in response to the multiplexing control signal; and an output unit configured to generate a frequency change clock signal having a frequency that is differently changed from the frequency of the clock signal using the clock signal and an output signal of the multiplexing unit.

In another embodiment, a signal frequency change circuit according to the embodiment includes: a delay line that includes a plurality of delay cells each having a chain structure of logic devices, delays a clock signal through activated delay cells in response to a delay control signal to generate a delay signal, and outputs output signals of the logic devices corresponding to half of a unit delay time in the chain structure of the logic devices of the plurality of delay cells as pre-frequency change clock signals; a detector that detects a specific phase of the clock signal using the delay signal and generates a phase locked completion signal; a controller that sequentially shifts the delay control signal and a multiplexing control signal using the clock signal supplied before an activation timing point of the phase locked completion signal; a multiplexer that selects and outputs one of the pre-frequency change clock signals in response to the multiplexing control signal; and an output unit that generates a frequency change clock signal having a frequency that is differently changed from the frequency of the clock signal using the clock signal and an output signal of the multiplexing unit.

In still another embodiment, a frequency change method of a signal frequency change circuit is a frequency change method of a signal frequency change circuit having a plurality of delay cells that delay and output an input signal by a unit delay time. The frequency change method of a signal frequency change circuit includes: generate a first delay signal by delaying an external clock signal through the plurality of delay cells, and generating second delay signals by delaying the external clock signal through each of the plurality of delay cells by a delay time reduced by a predetermined ratio as compared to the unit delay time; and selecting a second delay signal among the second delay signals corresponding to a timing point where a predetermined phase difference is generated between the external clock signal and the first delay signal, and changing a frequency of the external clock signal by combining the selected second delay signal and the external clock signal.

These and other features, aspects, and embodiments are described below in the period "Detailed Description."

BRIEF DESCRIPTION OF THE DRAWINGS

Features, aspects, and embodiments are described in conjunction with the attached drawings, in which.

DETAILED DESCRIPTION

Hereinafter, preferred embodiments will be described in detail with reference to the accompanying drawings.

Figure 1:
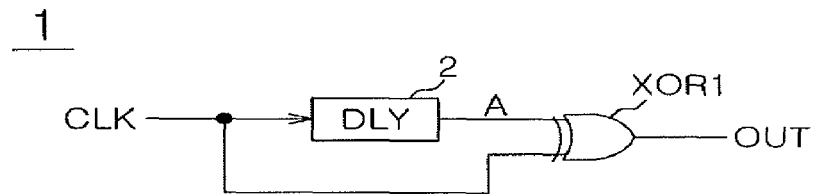
FIG. 1 is a circuit diagram of a signal frequency change circuit 1 according to one example of the prior art.
Figure 1:
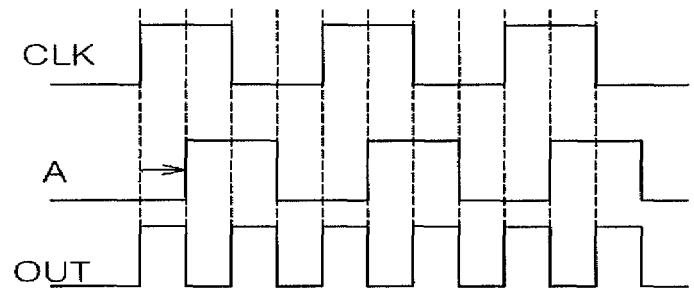
Figure 2:
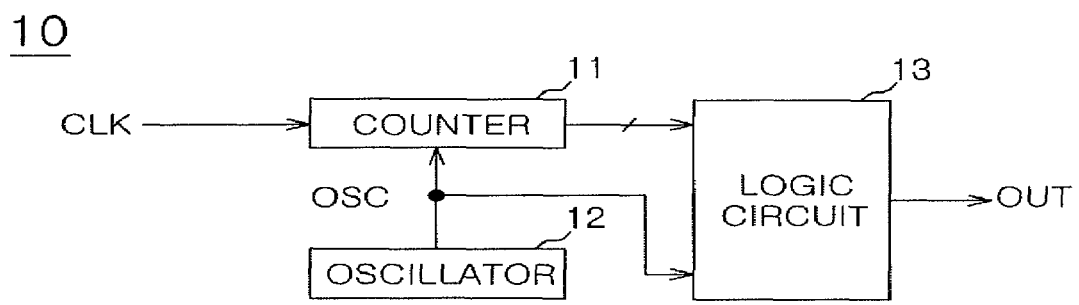
FIG. 2 is a block diagram of a signal frequency change circuit 10 according to another example of the prior art.
Figure 2:
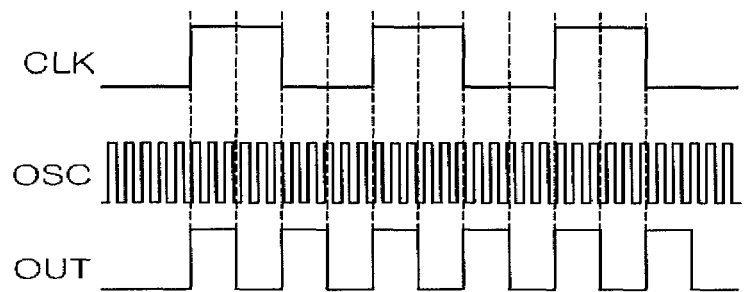
Figure 3:
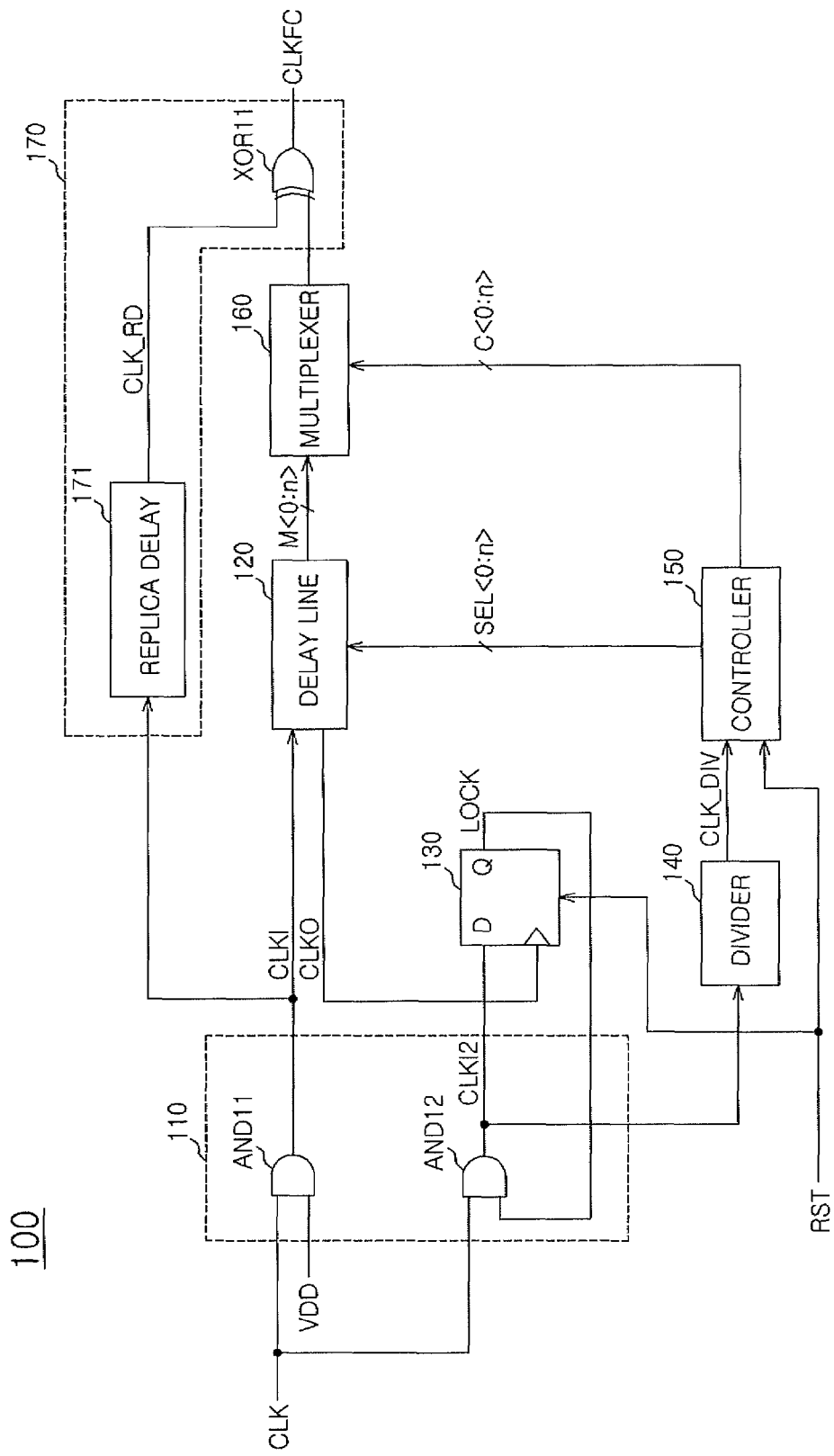
FIG. 3 is a block diagram of a signal frequency change circuit 100 according to the embodiment.

FIG. 3 is a block diagram of a signal frequency change circuit 100 according to the embodiment.

As shown in FIG. 3, the signal frequency change circuit 100 according to the embodiment includes an input unit 110, a delay line 120, a detector 130, a divider 140, a controller 150, a multiplexer 160, and an output unit 170.

The input unit 110 includes a first AND gate 'AND11' and a second AND gate 'AND12'.

Since a power supply voltage 'VDD' is applied to a first input terminal, the first AND gate 'AND11' is provided with a clock signal 'CLK' input through a second input terminal to the delay line 120 as first input signal 'CLKI'.

The second AND gate 'AND12' can transfer or interrupt the clock signal 'CLK' to the detector 130 in response to a phase locked completion signal 'LOCK'. In other words, the second AND gate 'AND12' transfers a second input signal 'CLKI2' to the detector 130 as the clock signal 'CLK' when the phase locked completion signal 'LOCK' is deactivated at a high level. The second AND gate 'AND12' interrupts the clock signal 'CLK' from being input to the detector 130 by locking the second input signal 'CLKI2' to a low level when the phase locked completion signal 'LOCK' is activated at a low level.

The first AND gate 'AND11', which is a dummy device, can be selectively used according to a circuit design scheme. In other words, it is preferable that a timing point when the clock signal 'CLK' is input to the delay line 120 matches a timing point when the clock signal 'CLK' is input to the detector 130. Therefore, in order to match the input timing points of the clock signal 'CLK', the first AND gate 'AND11' is configured to have the same signal delay time as the delay time of the second AND gate 'AND12'. As a result, the first input signal 'CLKI' and the second input signal 'CLKI2' can be considered to be the same signal in terms of the timing point.

The delay line 120 receives the first input signal 'CLKI and a delay control signal 'SEL<0:n>' and outputs a delay signal 'CLKO' and pre-frequency change clock signals 'M<0:n>'.

The delay signal 'CLKO' is a signal delaying the first input signal 'CLKI' by a time corresponding to the delay control signal 'SEL<0:n>' through the delay line 120.

The detector 130 can preferably be configured as a flip flop and is initialized in response to a reset signal 'RST'.

The detector 130 detects a falling edge of the second input signal 'CLKI2' in accordance to a rising edge of the delay signal 'CLKO' to activate the phase locked completion signal 'LOCK' at a low level.

The divider 140 divides the second input signal 'CLKI2' to generate a divided clock signal 'CLK_DIV'.

The controller 150 uses the divided clock signal 'CLK_DIV' to generate the delay control signal 'SEL<0:n>' and a multiplexing control signal 'C<0:n>'.

The multiplexing unit 160 selects and outputs one of the pre-frequency change clock signals 'M<0:n>' in response to the multiplexing control signal 'C<0:n>'. For example, when the multiplexing control signal 'C<n>' is activated, the multiplexing unit 160 selects and outputs the pre-frequency change clock signal 'M<n>'.

The output unit 170 includes a replica delay unit 171 and an XOR gate 'XOR11'.

The replica delay unit 171 is a delay device configured to have a delay time by a modeling delay time that models an internal delay time of the signal frequency change circuit of the embodiment. That is, a delay time until the first input signal 'CLKI' is input and the output signal of the multiplexing unit 160 is generated. The replica delay unit 171 delays the first input signal 'CLKI' by the modeling delay time to generate an output signal 'CLK_RD'.

The XOR gate 'XOR11' performs XOR on the output signal 'CLK_RD' of the replica delay unit 171 and the output signal of the multiplexing unit 160 to output the frequency change clock signal 'CLKFC'.

Figure 4:
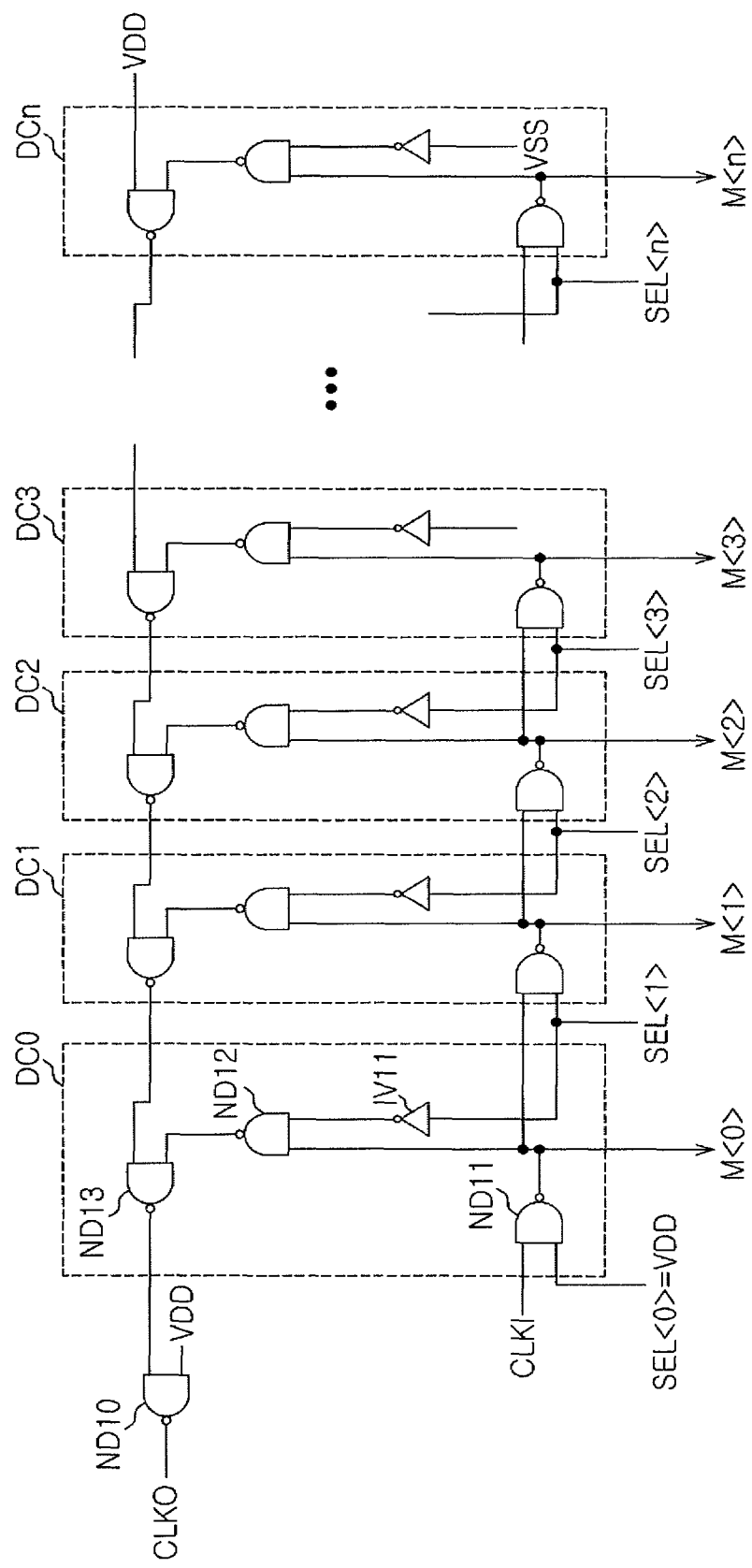
FIG. 4 is a circuit diagram of the delay line 120 of FIG. 3.

FIG. 4 is a circuit diagram of the delay line 120 of FIG. 3.

As shown in FIG. 4, the delay line 120 includes a NAND gate 'ND10' and a plurality of delay cells 'DC0 to DCn'.

Since the delay signal 'CLKO' via the delay signal 120 has an inverted phase with respect to the first input signal 'CLKI', then the NAND gate 'ND10' is configured to invert the phase of the delay signal 'CLKO' again in order to restore the original phase.

The delay control signal 'SEL<0:n>' is input to the plurality of delay cells 'DC0 to DCn' bit by bit and the pre-frequency change clock signal 'M<0:n>' is output bit by bit from each of the plurality of delay cells 'DC0 to DCn', respectively. The delay control signal 'SEL<0:n>' is a signal that determines whether each of the plurality of delay cells 'DC0 to DCn' is activated.

The plurality of delay cells 'DC0 to DCn' can be preferably configured to be the same. Among others, reviewing a configuration of one delay cell 'DC0', it basically has a NAND gate chain structure. In other words, the delay cell is configured of a plurality of NAND gates 'ND11 to ND13' of the chain structure and an inverter 'IV11'. The first input signal 'CLKI' is applied to one of the two input terminals of the NAND gate 'ND11' and the delay control signal 'SEL<0>' is applied to the other thereof. Since the delay cell 'DC0' is set to a default operation state, the power supply voltage 'VDD' is applied as the delay control signal 'SEL<0>'. The output signal of the NAND gate 'ND11' is output as the multiplexing control signal 'C<0>'.

The embodiment is a circuit that changes and outputs the frequency of the clock signal 'CLK'. In particular, the embodiment is configured to output the frequency change clock signal 'CLKFC' having a frequency that is two times higher than the frequency of the clock signal 'CLK'.

In order for the frequency change clock signal 'CLKFC' to have a frequency that is two times higher than the frequency of the clock signal 'CLK', the delay time of the pre-frequency change clock signal 'M<0>' should be set to half of the unit delay time, that is, a half the delay time of the delay cell 'DC0'. Therefore, the pre-frequency change clock signal 'M<0>' is output in any one having the delay time corresponding to half of the unit delay time among the plurality of NAND gates 'ND11 to ND13' configuring the delay cell 'DC0'. In the embodiment of FIG. 4, the example where the output signal of the NAND gate 'ND11' is output as the pre-frequency change clock signal 'M<0>' was described.

As described above, the embodiment can output the output of other NAND gates 'ND12 and ND13' as the pre-frequency change clock signal 'M<0>' by changing the circuit of the delay cell 'DC0', that is, controlling the size of the plurality of NAND gates 'ND11 to ND13' when the delay time of the pre-frequency change clock signal 'M<0>' corresponds to half of the unit delay time. Of course, a case where the delay cell is configured of other logic devices other than the NAND gate is envisioned to follow the foregoing principle.

Consequently, the pre-frequency change clock signal 'M<0:n>' has a delay time corresponding to half of the total delay time by the activated delay cells among the plurality of delay cells 'DC0 to DCn'. For example, the pre-frequency change clock signal 'M<n>' has a delay time corresponding to half of the delay time of all the plurality of delay cells 'DC0 to DCn'.

Figure 5:
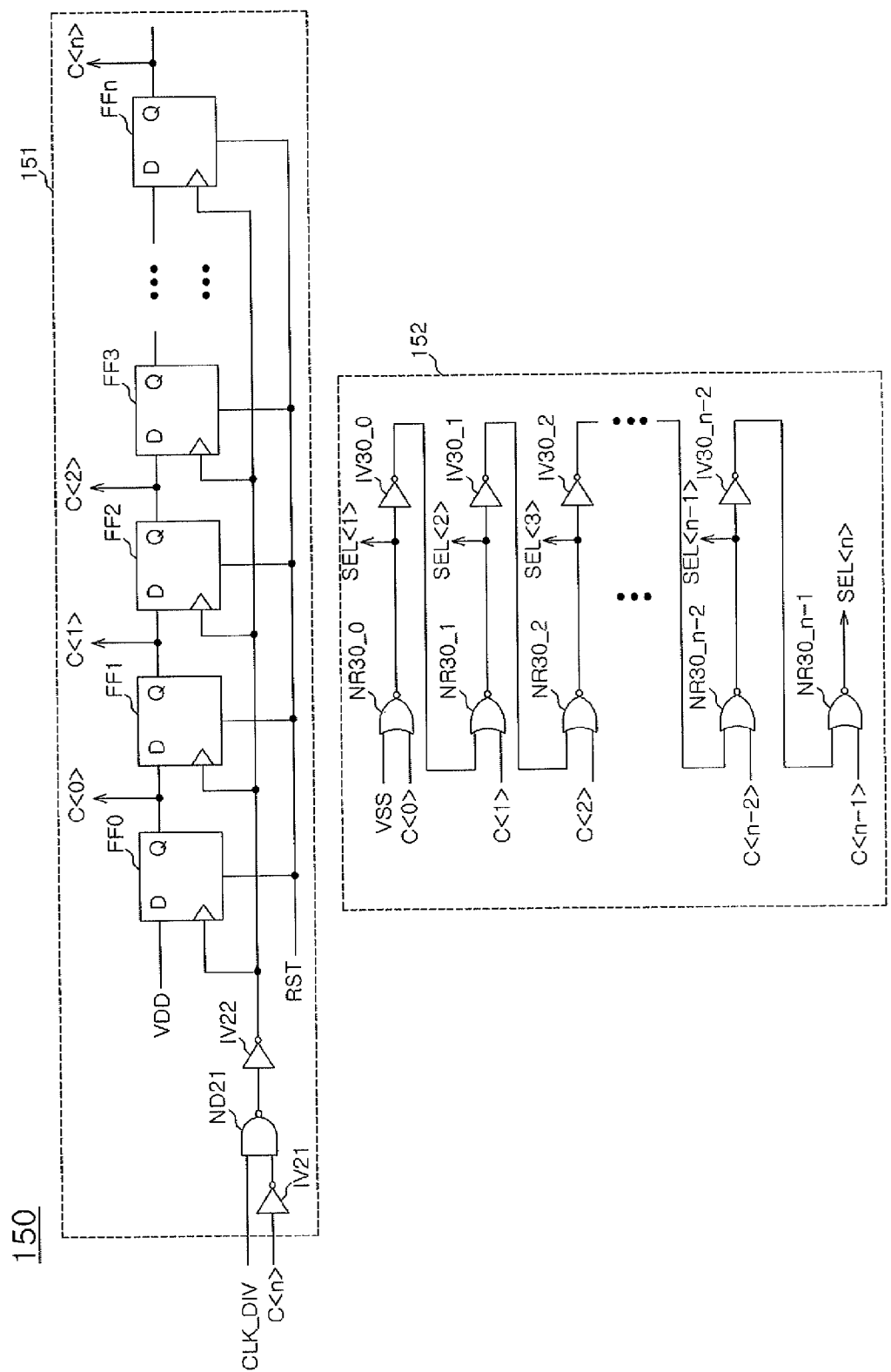
FIG. 5 is a circuit diagram of a controller 150 of FIG. 3.

FIG. 5 is a circuit diagram of the controller 150 of FIG. 3.

As shown in FIG. 5, the controller 150 includes a shift register 151 and a delay control signal generator 152.

The shift register 151 can include a plurality of inverters 'IV21 and IV22', a NAND gate 'ND21', and a plurality of flip flops 'FF0 to FFn'.

The delay control signal generator 152 can be configured of a plurality of NOR gates 'NR30_0 to NR30_n−1' and a plurality of inverters 'IV30_0 to IV30_n−2'.

Figure 6:
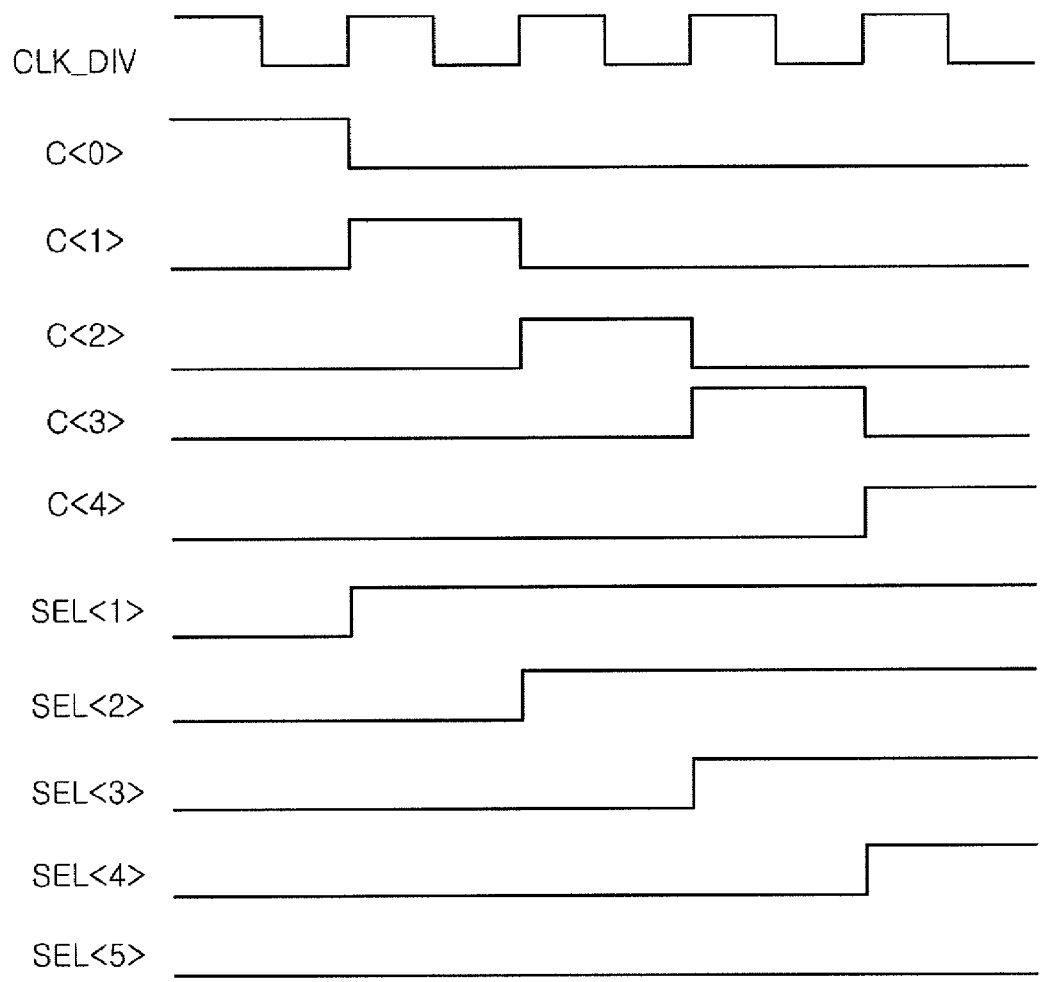
FIG. 6 is an output waveform diagram of a controller 150 of FIG. 3.

FIG. 6 is an output waveform diagram of a controller 150 of FIG. 3.

The shift register 151 shifts a level of the power supply voltage 'VDD' in response to the dividing clock signal 'CLK_DIV' to generate the multiplexing control signal 'C<0:n>' as shown in FIG. 6. When the most significant bit 'C<n>' of the multiplexing control signal 'C<0:n>' is activated at a high level, the shift register 151 interrupts the input of the dividing clock signal 'CLK_DIV' to stop the power supply voltage 'VDD' shift operation.

The delay control signal generator 152 combines the multiplexing control signals 'C<0:n−1>' by two bit, in accordance to a sequence of bits, to generate the delay control signals 'SEL<1:n>' as shown in FIG. 6. However, the delay control signal 'SEL<1>' are generated by a combination of the multiplexing control signal 'C<0>'. For example, the ground voltage 'VSS' and the multiplexing control signal 'C<0>' are XORed to generate the delay control signal 'SEL<1>' and the multiplexing control signal 'C<0>' and the multiplexing control signal 'C<1>' of a subsequent sequence are XORed to generate the delay control signal 'SEL<2>'.

The operation of the signal frequency change circuit 100 according to the embodiment configured as above will be described below.

The phase locked completion signal 'LOCK' is a state non-activated at a high level in an initial operation state. Therefore, the second input signal 'CLKI2' output from the second AND gate 'AND12' is input to the detector 130 and the divider 140.

The delay line 120 of FIG. 4 delays the first input signal 'CLKI' by the delay time of the delay cell (for example, 'DC0') activated in accordance to an initial value of the delay control signal 'SEL<0:n>' and outputs the delay signal 'CLKO'. At this time, the initial value of the delay control signal 'SEL<0:n>' activates only the 'SEL<0>' among all the signal bits.

The controller 150 of FIG. 5 sequentially shifts the multiplexing control signal 'C<0:n>' and the delay control signal 'SEL<0:n>' in accordance to the dividing clock signal 'CLK-DIV' generated from the divider 140 as shown in FIG. 6.

Meanwhile, the detector 130 detects the falling edge of the second input signal 'CLKI2' in accordance to the rising edge of the delay signal 'CLKO' output from the delay line 120.

The number of delay cells activated in accordance to the delay control signal 'SEL<0:n>' sequentially activated is increased, such that the delay time of the delay line 120 is increased.

Figure 7:
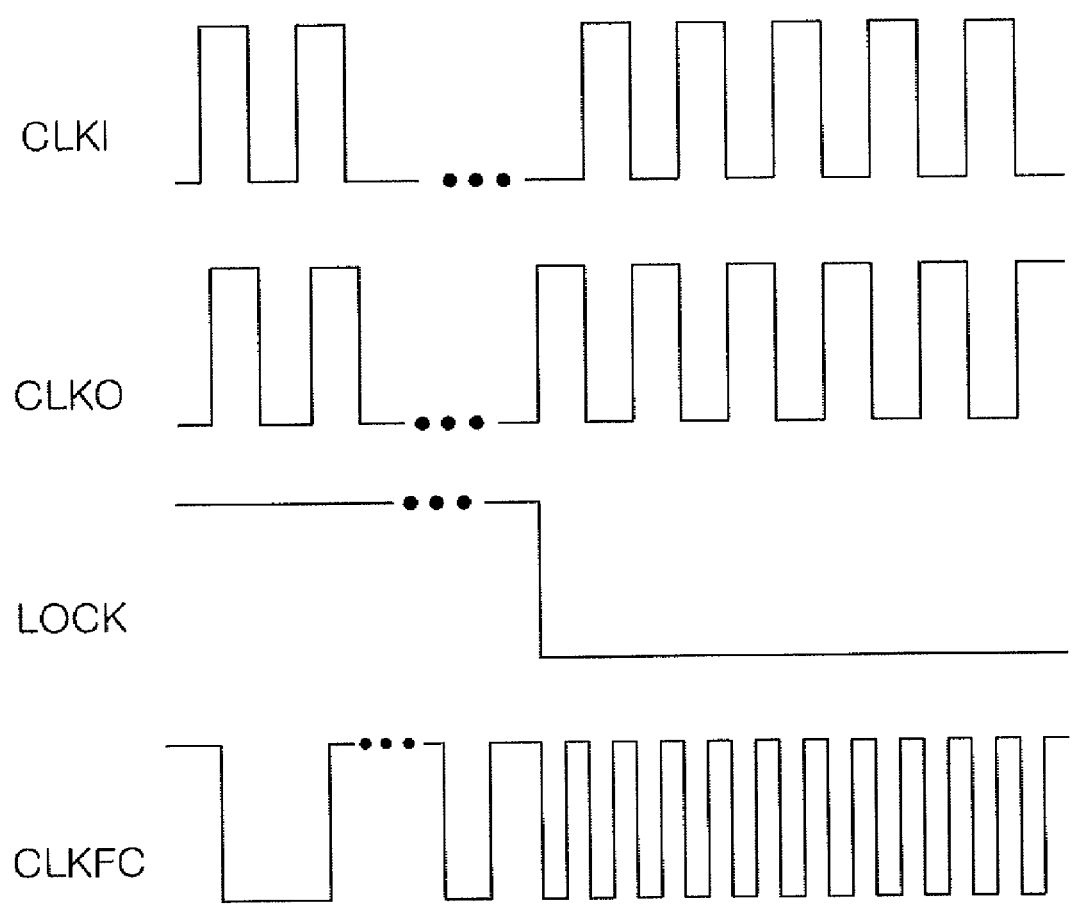
FIG. 7 is an output waveform diagram of a signal frequency change circuit 100 according to the embodiment.

FIG. 7 is an output waveform diagram of a signal frequency change circuit 100 according to the embodiment.

As shown in FIG. 7, the delay time of the delay signal 'CLKO' is gradually increased and the detector 130 detects the falling edge of the second input signal 'CLKI2' at a predetermined timing point to activate the locked completion signal 'LOCK' at a low level.

The second AND gate 'AND12' locks the second input signal 'CLKI2' at a low level as the phase locked completion signal 'LOCK' is activated at a low level, thereby interrupting the clock signal 'CLK' from being input to the detector 130 and the divider 140.

Since the second input signal 'CLKI2' is locked at a low level, the detector 130 maintains the phase locked completion signal 'LOCK' at a low level and the controller 150 stops the shift operation of the multiplexing control signal 'C<0:n>' and the delay control signal 'SEL<0:n>'.

For example, assuming that the controller 150 is a state of activating the multiplexing control signal 'C<4>' and assuming the delay control signal 'SEL<4>' at the timing point where the phase locked completion signal 'LOCK' is activated at a low level, then the multiplexing control signal 'C<5:n>' and the delay control signal 'SEL<5:n>' are not activated.

The multiplexing unit 160 selects and outputs the pre-frequency change clock signal 'M<4>' among the pre-frequency change clock signals 'M<0:n>' in response to the activated multiplexing control signal 'C<4>'.

At this time, the delay time of the pre-frequency change clock signal 'M<4>' output through the delay cell 'DC4' among the activated delay cells 'DC0 to DC4' corresponds to half of the delay time of the first input signal 'CLKI' via the delay cells 'DC0 to DC4' in response to the activation of the delay control signal 'SEL<4>'.

The XOR gate 'XOR11' of the output unit 170 performs the XOR on the first input signal delayed by the modeling delay time through the pre-frequency change clock signal 'M<4>' and the replica delay unit 171 to output the frequency change clock signal 'CLKFC' as shown in FIG. 7. At this time, a phase difference of the pre-frequency change clock signal 'M<4>' and the output signal 'CLK_RD' of the replica delay unit 171 corresponds to ¼ of a period of the output signal 'CLK_RD'. Therefore, when the frequency change clock signal 'M<4>' and the output signal 'CLK_RD' are XORed, then the frequency change clock signal 'CLKFC' having a frequency that is two times higher than the frequency of the clock signal 'CLK' can be generated.

As shown in FIG. 7, it can be appreciated that after the phase locked completion signal 'LOCK' is deactivated at a low level, the frequency change clock signal 'CLKFC', which has a frequency twice the first input signal 'CLKI' and a constant duty cycle, can be generated.

The present invention uses a scheme of detecting a timing point when the first input signal 'CLKI' and the delay signal 'CLKO' have a phase just opposite to each other through the delay line 120 and the detector 130. Therefore, the frequency change clock signal 'CLKFC', which has a frequency that is two times higher than that of the clock signal and has a uniform duty cycle, can be generated regardless of the frequency of the clock signal 'CLK'.

Although the foregoing embodiment describes the embodiment of changing the frequency of the input signal to a frequency twice as high, the embodiment is not limited thereto. The operation principle of the foregoing embodiment is that the delay time of the pre-frequency change clock signal 'M<0>' should be set to half of the unit delay time, that is, half of the delay time of the delay cell 'DC0' in order for the frequency change clock signal 'CLKFC' to have a frequency that is two times higher than that of the clock signal. As can be appreciated from the foregoing embodiments, it is possible to change the frequency of the input signal using different multiple, for example, three times, four times, etc. by changing the design of the delay line 120.

While certain embodiments have been described above, it will be understood that the embodiments described are by way of example only. Accordingly, the device and method described herein should not be limited based on the described embodiments. Rather, the devices and methods described herein should only be limited in light of the claims that follow when taken in conjunction with the above description and accompanying drawings.

What is claimed is:

1. A signal frequency change circuit, comprising:
   a delay line configured to delay a clock signal by a first delay time in response to a delay control signal to generate a delay signal and to delay the clock signal by a second delay time smaller than a first delay time to generate pre-frequency change clock signals;
   a detector configured to detect a specific phase of the clock signal using the delay signal to generate a phase locked completion signal;
   a controller configured to sequentially shift the delay control signal and a multiplexing control signal using the clock signal supplied before an activation timing point of the phase locked completion signal;
   a multiplexer configured to select and output one of the pre-frequency change clock signals in response to the multiplexing control signal; and
   an output unit configured to generate a frequency change clock signal having a frequency that is changed differently from the frequency of the clock signal by using the clock signal and an output signal of the multiplexing unit.

2. The signal frequency change circuit according to claim 1, wherein the second delay time corresponds to half of the first delay time.

3. The signal frequency change circuit according to claim 1, wherein the delay line includes a plurality of delay cells, each of the plurality of delay cells has a chain structure of a plurality of logic devices, and an output signal of one of the plurality of logic devices which outputs a signal corresponding to the second delay time is generated as a signal bit of the pre-frequency change clock signal in the chain structure.

4. The signal frequency change circuit according to claim 1, wherein the detector is configured to detect the falling edge of the clock signal using the rising edge of the delay signal to activate the phase locked completion signal.

5. The signal frequency change circuit according to claim 4, wherein the detector includes a flip flop configured so that the clock signal is input to an input terminal, the delay signal is input to a clock signal terminal, and the phase locked completion signal is output to an output terminal.

6. The signal frequency change circuit according to claim 1, wherein the controller is configured to stop shifting the multiplexing control signal in response to an activation of a most significant bit of the multiplexing control signal.

7. The signal frequency change circuit according to claim 1, wherein the controller comprises:
   a shift register configured to generate the multiplexing control signal by shifting a level of a power supply voltage in response to the clock signal; and
   a delay control signal generator configured to generate the delay control signal by combining the multiplexing control signal by 2 bits in accordance to a sequence of a bit.

8. The signal frequency change circuit according to claim 7, wherein the shift register is configured to receive the clock signal when a most significant bit of the multiplexing control signal is non-activated.

9. The signal frequency change circuit according to claim 7, wherein the delay control signal generator is configured to generate the delay control signal by combining the remaining bits other than a least significant bit of the multiplexing control signal by 2 bits in accordance to a sequence of a bit.

10. The signal frequency change circuit according to claim 1, wherein the output unit is configured to generate the frequency change clock signal by combining an output signal of the multiplexer and a signal delaying the clock signal until the clock signal is input and the output signal of the multiplexer is generated.

11. The signal frequency change circuit according to claim 1, wherein the output unit comprises:
   a replica delay unit configured to receive the clock signal; and
   a logic device configured to generate the frequency change clock signal by XORing an output of the replica delay unit and an output of the multiplexer.

12. The signal frequency change circuit according to claim 1, further comprising an input unit that provides the clock signal to the detector and to the controller during a deactivated period of the phase locked completion signal.

13. The signal frequency change circuit according to claim 1, further comprising a divider that divides the clock signal and provides the divided clock signal to the controller.

14. A signal frequency change circuit, comprising:
   a delay line that includes a plurality of delay cells in which each delay cell has a chain structure of logic devices, wherein the delay line is configured to delay a clock signal through activated delay cells in response to a delay control signal to generate a delay signal, and the delay line outputs output signals of the logic devices corresponding to half of a unit delay time in the chain structure of the plurality of delay cells as pre-frequency change clock signals;
   a detector configured to detects a specific phase of the clock signal using the delay signal and generates a phase locked completion signal;
   a controller configured to sequentially shift the delay control signal and shift a multiplexing control signal using the clock signal supplied before an activation timing point of the phase locked completion signal;
   a multiplexer configured to select and to output one of the pre-frequency change clock signals in response to the multiplexing control signal; and
   an output unit configured to generate a frequency change clock signal having a frequency changed differently from the frequency of the clock signal by using the clock signal and an output signal of the multiplexing unit.

15. The signal frequency change circuit according to claim 14, wherein the detector is configured to detect the falling edge of the clock signal by using the rising edge of the delay signal to activate the phase locked completion signal.

16. The signal frequency change circuit according to claim 15, wherein the detector includes a flip flop configured so that the clock signal is input to an input terminal, the delay signal is input to a clock signal terminal, and the phase locked completion signal is output to an output terminal.

17. The signal frequency change circuit according to claim 14, wherein the controller is configured to stop shifting the multiplexing control signal in response to an activation of a most significant bit of the multiplexing control signal.

18. The signal frequency change circuit according to claim 14, wherein the controller comprises:
    a shift register configured to generate the multiplexing control signal by shifting a level of a power supply voltage in response to the clock signal; and
    a delay control signal generator configured to generate the delay control signal by combining the multiplexing control signal by 2 bits in accordance to a sequence of a bit.

19. The signal frequency change circuit according to claim 18, wherein the shift register is configured to receive the clock signal when a most significant bit of the multiplexing control signal is deactivated.

20. The signal frequency change circuit according to claim 18, wherein the delay control signal generator is configured to generate the delay control signal by combining the remaining bits other than a least significant bit of the multiplexing control signal in accordance to a sequence of a bit.

21. The signal frequency change circuit according to claim 14, wherein the output unit is configured to generate the frequency change clock signal by combining an output signal of the multiplexer and a signal delaying the clock signal by a delay time from an inputting of the clock signal to a generating of the output signal of the multiplexer.

22. The signal frequency change circuit according to claim 14, wherein the output unit includes:
    a replica delay unit configured to receive the clock signal; and
    a logic device configured to generate the frequency change clock signal by XORing an output of the replica delay unit and an output of the multiplexer.

23. The signal frequency change circuit according to claim 14, further comprising an input unit that provides the clock signal to the detector and the controller during a deactivated period of the phase locked completion signal.

24. The signal frequency change circuit according to claim 14, further comprising a divider that divides the clock signal and provides the divided clock signal to the controller.

25. A frequency change method of a signal frequency change circuit having a plurality of delay cells that delay and output an input signal by a unit delay time, comprising:
    generating a first delay signal by delaying an external clock signal through the plurality of delay cells, and generating second delay signals by delaying the external clock signal through each of the plurality of delay cells by a delay time reduced by a predetermined ratio as compared to the unit delay time; and
    selecting a second delay signal among the second delay signals corresponding to a timing point where a predetermined phase difference is generated between the external clock signal and the first delay signal, and changing a frequency of the external clock signal by combining the selected second delay signal and the external clock signal.

26. The frequency change method of a signal frequency change circuit according to claim 25, wherein the predetermined phase difference is a phase difference by half of a period of the clock signal.

27. The frequency change method of a signal frequency change circuit according to claim 25, wherein the delay time reduced by the predetermined ratio is a delay time corresponding to half of the unit delay time.

28. The frequency change method of a signal frequency change circuit according to claim 25, wherein the change in the frequency of the external clock signal is performed by doubling the frequency of the external clock signal.

29. The frequency change method of a signal frequency change circuit according to claim 25, wherein the combination of the selected second delay signal and the external clock signal is performed by combining a signal delaying the external clock signal by a modeling delay time and the selected second delay signal, and
    the modeling delay time is a delay time from an inputting of the external clock signal to a selecting of the second delay signal.

* * * * *